United States Patent [19]
Rodriguez

[11] Patent Number: 5,975,836
[45] Date of Patent: Nov. 2, 1999

[54] APPARATUS FOR VISUALLY READING SEMICONDUCTOR WAFER IDENTIFICATION INDICIA

[75] Inventor: Jose Omar Rodriguez, Orange County, Fla.

[73] Assignee: Lucent Technologies Inc., Murray Hill, N.J.

[21] Appl. No.: 08/824,574

[22] Filed: Mar. 26, 1997

[51] Int. Cl.⁶ .................................................. H01L 21/68
[52] U.S. Cl. ........................ 414/787; 414/937; 414/800
[58] Field of Search ................................. 414/404, 417, 414/937, 938, 786, 787, 800, 811

[56] References Cited

U.S. PATENT DOCUMENTS

| | | | |
|---|---|---|---|
| 4,108,323 | 8/1978 | Shambelar et al. | 414/417 |
| 4,490,087 | 12/1984 | Ryan et al. | 414/417 |
| 4,536,122 | 8/1985 | Herrmann et al. | 414/404 |
| 4,892,455 | 1/1990 | Hine | 414/417 |
| 5,188,499 | 2/1993 | Tarng et al. | 414/404 |
| 5,240,557 | 8/1993 | Dyer et al. | 414/937 X |
| 5,382,128 | 1/1995 | Takahashi et al. | 414/404 |
| 5,386,481 | 1/1995 | Hine et al. | 414/417 X |
| 5,730,575 | 3/1998 | Nichols et al. | 414/417 X |
| 5,735,662 | 4/1998 | Nichols et al. | 414/417 X |

FOREIGN PATENT DOCUMENTS

| | | | |
|---|---|---|---|
| 58-144022 | 8/1983 | Japan | 414/417 |
| 62-108535 | 5/1987 | Japan | 414/404 |
| 22-218431 | 9/1988 | Japan | 414/404 |
| 278741 | 11/1989 | Japan | 414/404 |
| 69325 | 3/1994 | Japan | 414/417 |
| 72508 | 3/1994 | Japan | 414/937 |

OTHER PUBLICATIONS

Horizontal Wafer Transfer Machines brochure, H–Square Corporation, 1994.

*Primary Examiner*—David A. Bucci
*Attorney, Agent, or Firm*—Gibbons, Del Deo, Dolan, Griffinger & Vecchione

[57] ABSTRACT

The apparatus has a substantially planar base having a surface which defines a wafer cassette receiving station and a wafer receiving station. A transportable wafer cassette is removably coupled to the base in the wafer cassette receiving station. The transportable wafer cassette is provided for holding a plurality of wafers in an axially aligned manner, each of the wafers having identification indicia disposed on a surface thereof. A wafer receiving cassette is coupled to the base adjacent to the transportable wafer cassette in the wafer receiving station. A first reciprocally moveable wafer transfer member is attached to the base, and is operative for transferring the wafers held in the transportable wafer cassette to the wafer receiving cassette. The wafer transfer member includes a wedge shaped block for aligning the wafers in the wafer receiving cassette in an axially offset manner relative to each other so that the identification indicia on the surface of each wafer is visible for reading by an operator. A second reciprocally moveable wafer transfer member disposed adjacent to the base is provided for transferring the remaining wafers from the wafer receiving cassette to the transportable wafer cassette and aligning the wafers in the transportable wafer cassette in an axially aligned manner.

22 Claims, 3 Drawing Sheets

APPARATUS FOR VISUALLY READING SEMICONDUCTOR WAFER IDENTIFICATION INDICIA

FIELD OF THE INVENTION

The present invention relates to semiconductor wafer handling and more specifically, to an apparatus for allowing the visual reading of identifying indicia inscribed on semiconductor wafers which are stored in a conventional semiconductor wafer cassette.

BACKGROUND OF THE INVENTION

It is well known that in order to meet achieve low price and high supply demands for semiconductor devices, semiconductor manufacturers have developed semiconductor wafer processing techniques and methods which are oriented toward batch processing. Batch processing techniques usually involve the temporary storage and transportation of a plurality of semiconductor wafers from one processing station to another in the manufacturing facility. This is almost universally accomplished by employing plastic semiconductor wafer cassettes which typically hold twenty-five semiconductor wafers.

In the ordinary course of handling and processing the semiconductor wafers, it is necessary to inscribed or otherwise mark each semiconductor wafer with indicia which provides important processing information. Such information typically pertains to the plant number where the semiconductor wafer is being processed, the lot number to which the semiconductor wafer belongs, the number of the semiconductor wafer and other like information in order to enables the proper processing and production routing of the wafers.

During the processing of semiconductor wafers it is often desirable to select a specific one or more wafers from the wafer cassette for various reasons such as quality control audits and the like. This requires the ability to visually read the identification indicia located on each of the wafers in the cassette at the same time so that the desired wafer can be located and removed from the cassette. Presently, this is only possible by individually removing each wafer one at a time and reading its identifying indica and then loading the wafer back into the cassette until the desired wafer is located which is extremely time consuming and involves considerable risk of wafer contamination and breakage.

Accordingly, there is a need for an apparatus which avoids the need for individually removing each wafer one at a time in order to visually read the identification indicia located on the wafer.

SUMMARY OF THE INVENTION

In accordance with the present invention, there is provided an apparatus for allowing an operator to visually read identification indicia disposed on a plurality of wafers held in a transportable wafer cassette. The apparatus comprises a base adapted to removably couple the transportable wafer cassette, and a wafer receiving cassette coupled to said base adjacent to said transportable wafer cassette. The transportable wafer cassette is provided for holding a plurality of wafers each having identification indicia disposed on a surface thereof, and the wafer receiving cassette is provided for receiving the plurality of wafers held in the transportable wafer cassette. A reciprocally moveable wafer transfer member is attached to the base, and is operative for transferring the wafers held in the transportable wafer cassette to the wafer receiving cassette. The wafer transfer member includes means for aligning the wafers in the wafer receiving cassette in an axially offset manner relative to each other so that the identification indicia on the surface of each wafer is visible for reading by an operator. This allows the operator to identify and remove one or more of the wafers from the wafer receiving cassette.

In accordance with another aspect of the present invention, a second reciprocally moveable wafer transfer member is provided adjacent to the base, for transferring the wafers from the wafer receiving cassette to the transportable wafer cassette.

DESCRIPTION OF THE DRAWINGS

A more complete understanding of the present invention may be obtained from consideration of the following description in conjunction with the drawings in which.

DETAILED DESCRIPTION OF VARIOUS ILLUSTRATIVE EMBODIMENTS

Figure 1A:
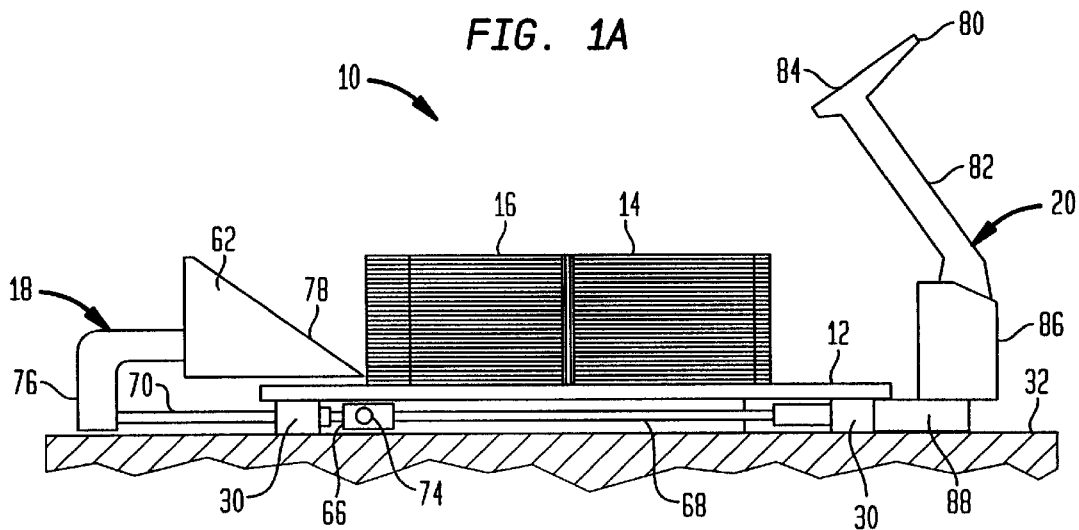
FIG. 1A is a side elevational view of an embodiment of the wafer reading apparatus of the present invention.
Figure 1B:
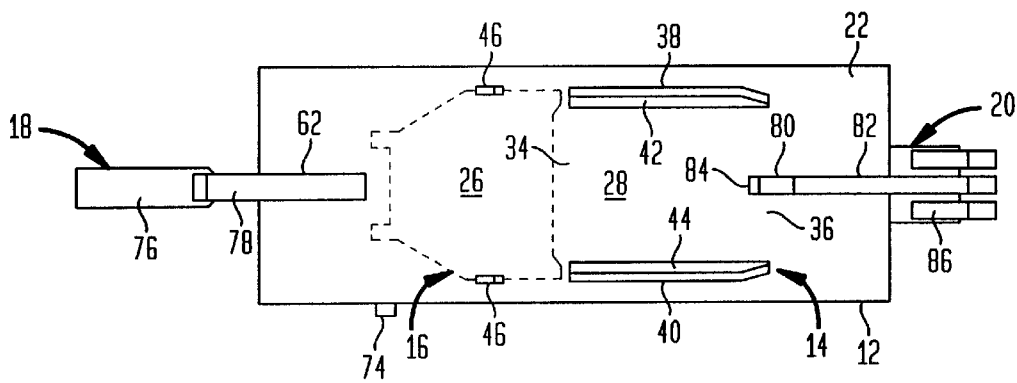
FIG. 1B is a top plan view of the wafer reading apparatus of FIG. 1A.
Figure 1C:
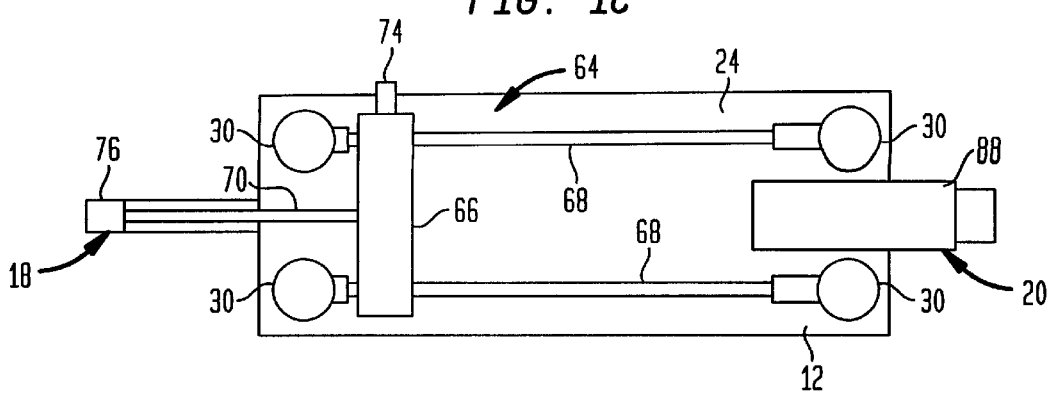
FIG. 1C is a bottom plan view of the wafer reading apparatus of FIG. 1A.

Referring collectively to FIGS. 1A–1C, an embodiment of the wafer reading apparatus 10 of the present invention is shown. The apparatus 10 generally comprises a base 12, a fixed, pass-through wafer receiving cassette 14, a transportable wafer cassette 16, and reciprocally movable first and second wafer transfer members 18, 20.

The base 12 is made from plastic, and defines an upper surface 22 and a lower surface 24. The upper surface 22 of the base 12 is divided into a cassette receiving station 26 and a wafer receiving station 28. The lower surface 24 of the base 12 includes a foot member 30 disposed at each corner thereof. The foot members 30 elevate the base 12 of the apparatus 10 above an apparatus supporting surface 32 in order to provide clearance for other components of the apparatus which will be described later on.

Figure 2:
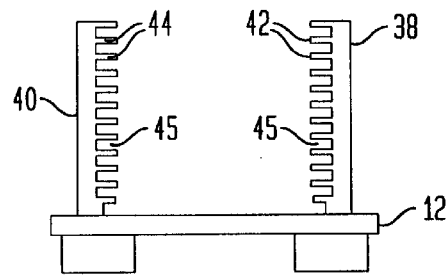
FIG. 2 is an end view of the fixed wafer cassette.

The fixed, pass-through wafer receiving cassette 14 has a loading end 34 and a discharge end 36, and is permanently attached to the upper surface 22 of the base 12 in the area designated the wafer receiving station 28. The fixed wafer receiving cassette 14 consists of spaced apart and parallel oriented first and second wafer support members 38, 40 made of plastic. As best seen in FIG. 2, each wafer support member 38, 40 includes a plurality of shelves or ledges 42, 44. The ledges 42 of the first support member 38 face the ledges 44 of the second support member 40 to define a plurality of wafer supporting slots 45 for slidably receiving individual semiconductor wafers. In the preferred embodiment, the support members 38, 40 define twenty-five wafer supporting slots 45 which enables the fixed wafer receiving cassette 14 to receive and hold a standard complement of twenty-five semiconductor wafers, although the wafer receiving cassette 14 can be configured to hold any number of semiconductor wafers if desired. In any case, the first and second wafer support members 38, 40 are securely attached to the upper surface 22 of the base 12 using any suitable method. For example, screw fasteners, clips, latches, adhesive can be used for attaching the wafer support members 38, 40 to the upper surface 22 of the base 12.

A pair of wafer cassette metal alignment guides 46 are attached to the upper surface 22 of the base 12 in the area of the cassette receiving station 26. The guides 46 enable the transportable wafer cassette 16 containing a standard complement of up to twenty-five semiconductor wafers, to be removably mounted to the upper surface 22 of the base 12 in the area of the cassette receiving station 26, immediately adjacent to and in alignment with the loading end 34 of the wafer receiving cassette 14, so that the semiconductor wafers contained therein can be identified as will be later explained in greater detail.

Figure 3A:
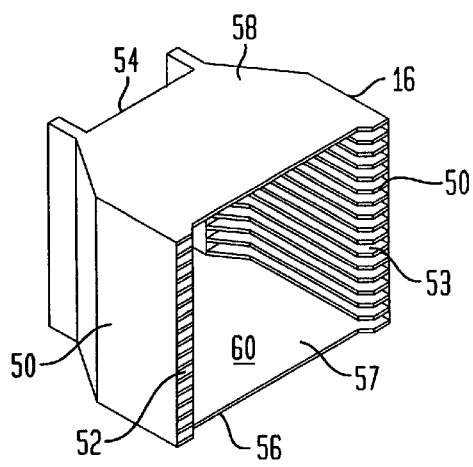
FIG. 3A is a perspective view of the transportable wafer cassette from the second end thereof.
Figure 3B:
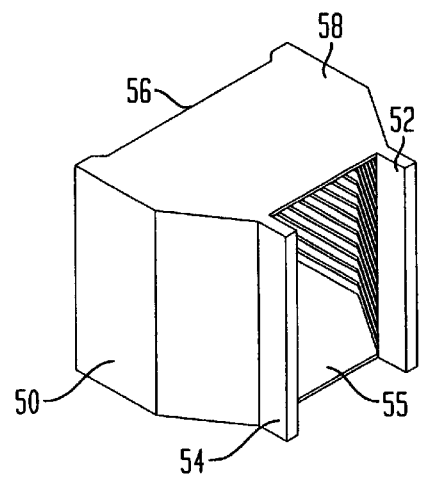
FIG. 3B is a perspective view of the transportable wafer cassette from the first end thereof.

Referring to FIGS. 3A and 3B, the transportable wafer cassette 16 used in the apparatus is a standard plastic wafer cassette. During semiconductor wafer processing, semiconductor wafers are temporarily stored and transported from one processing station to another in the transportable wafer cassette 16. The transportable wafer cassette 16 includes a pair of spaced apart and parallel oriented first and second wafer support walls 50, each having a plurality of shelves or ledges 52. The walls 50 taper toward each other at a first end 54 to define a first opening 55 that is sufficiently small to retain the wafers therein while still large enough to allow first wafer transfer member 18 to pass therethrough. At a second end 56 the walls 50 define a second opening 57 from which the semiconductor wafers are removed from and inserted into the cassette 16. The wafer support walls are coupled together by a top wall 58 and a bottom wall 60. The opposing ledges 52 define a plurality of wafer supporting slots 53 for slidably receiving individual semiconductor wafers. The wafer supporting slots 53 of the transportable wafer cassette 16 correspond in number and spacing to the wafer supporting slots 45 of the wafer receiving cassette 14. Thus, when the transportable wafer cassette 16 is coupled to the base adjacent to the wafer receiving cassette, each wafer supporting slot 53 of the transportable wafer cassette 16 lies in the same plane with a corresponding wafer supporting slot 45 of the wafer receiving cassette 14. As mentioned earlier, the transportable wafer cassette 16 is configured to receive and hold a standard complement of twenty-five semiconductor wafers, although the cassette 16 can be configured to hold any desired number of semiconductor wafers. The bottom wall 60 of the transportable wafer cassette 16 is adapted to slide between the metal alignment guides 46 attached to the upper surface 22 of the base 12. Accordingly, the transportable wafer cassette 16 can be removably attached to the upper surface 22 of the base 12 in the cassette receiving station 26. When the transportable wafer cassette 16 is coupled to the base 12, it is oriented so that the accessible second end 56 opens into the loading end 34 of the wafer receiving cassette 14.

Referring again to FIGS. 1A–1C, the first wafer transfer member 18 is provided at the cassette receiving station 26 of the base 12. The first wafer transfer member 18 is used for simultaneously transferring all the wafers held in the transportable wafer cassette 16 to the wafer receiving cassette 14 and aligning the wafers in the wafer receiving cassette 14 in an axially-offset manner so that the top end surfaces of the wafers, which have identification indicia disposed thereon as will be further explained, are all simultaneously viewable by an operator. The first wafer transfer member 18 consists of a wedge-shaped block 62 and shuttle assembly 64 which allows reciprocal movement of the wedge-shaped block 62 over the upper surface 22 of the base 12 from the cassette receiving station 26 to the wafer receiving station 28. The shuttle assembly 64 is disposed under the lower surface 24 of the base 12 and includes a slide member 66 that moves along a pair of guide posts 68 which extend between the foot members 30. A rod link 70 is attached to a central area of the slide member 66 so that the rod link 70 and the slide member 66 form a T-shaped shuttle element. One end of the slide member 66 includes a finger gripping post 74 which allows manual operation of the first wafer transfer member 18 by the operator. An L-shaped arm 76 is coupled the rod link 70 and the wedge-shape block 62. The wedge-shaped block 62 has an inclined wafer engaging surface 78 that engages the wafers and provides the axially offset alignment thereof.

The second wafer transfer member 20 is provided at the wafer receiving station 28 of the base 12 for returning the wafers from the wafer receiving cassette 14 to the transportable wafer cassette 16. The second wafer transfer member 20 consists of a vertically extending wafer engaging block 80 attached to one end of a pivoting arm 82. The wafer engaging block 80 includes a vertical wafer engaging surface 84 which axially aligns all the wafers as it pushes and slides the wafers from the fixed wafer receiving cassette 14 back into the transportable wafer cassette 16. The pivoting arm 82 is pivotally attached to a hinge bracket 86 which is mounted on an elongated support member 88 that rests on the supporting surface 32 and extends under the base 12 between a pair of the foot members 30. The second wafer transfer member 20 moves in a reciprocal manner relative to the base 12 so that the wafer engaging block 80 travels over the upper surface 22 of the base 12 from the wafer receiving station 28 to the cassette receiving station 26.

Figure 4:
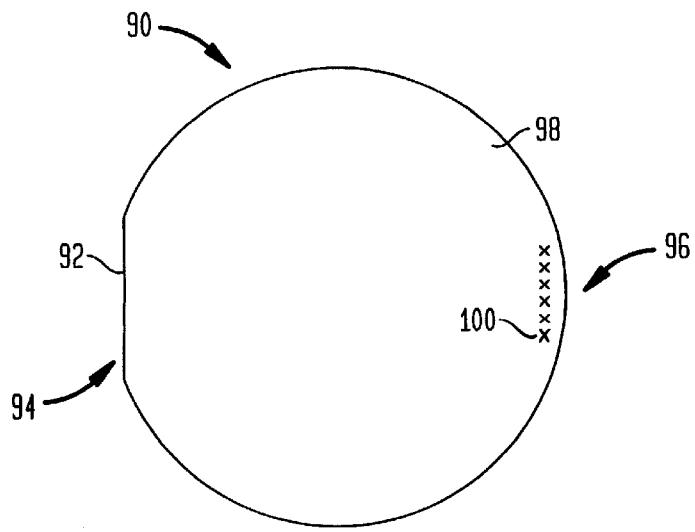
FIG. 4 is a top plan view of a semiconductor wafer.

Referring to FIG. 4, one of the semiconductor wafers to be identified using the apparatus of the present invention is shown. The semiconductor wafer 90 has an upper surface 98 and a circular shape with an orientation flat 92 formed on a portion of the wafer's edge. The flat 92 marks a bottom 94 the wafer 90. The portion of the wafer's edge opposite to the flat 92 is a top 96 of the wafer 90. Inscribed or otherwise marked at the top 96 of the wafer 90 on the upper surface 98 thereof, is identification indicia 100.

The operation of the apparatus 10 of the present invention will now be described. When it becomes necessary to select one or more semiconductor wafers 90 which are being randomly stored in the transportable wafer cassette 16, the transportable wafer cassette 16 is first placed on a flat finding apparatus (not shown) which rotates all the wafers 90 in the cassette 16 so that the tops 96 of the wafers 90 are all oriented at the second end 56 of the transportable wafer cassette 16. With the first wafer transfer member 18 out and away from the base 12 and the second wafer transfer member 20 pivoted up as shown in FIG. 1A, the transportable wafer cassette 16 is attached to the upper surface 22 of the base 12 between the metal alignment guides 46 in the cassette receiving station 26. The transportable wafer cassette 16 is oriented so that the second end 56 faces the loading end 34 of the fixed wafer receiving cassette 14.

Figure 5A:
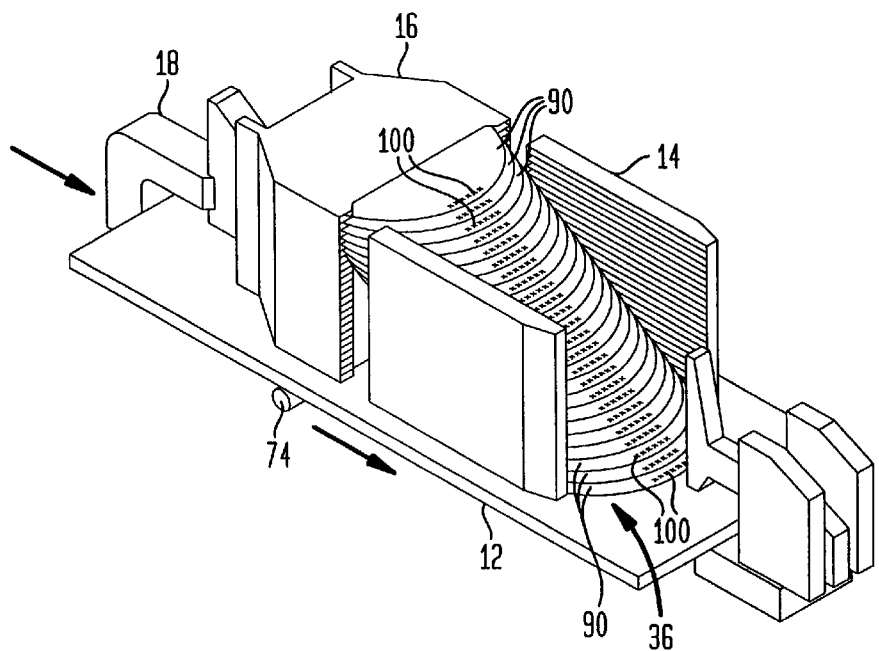
FIGS. 5A and 5B are top perspective views which demonstrate the operation of the wafer reading apparatus of the present invention.

The wafers 90 held in the transportable cassette 16 are then transferred to the fixed wafer receiving cassette 14 using the first wafer transfer member 18 as shown in FIG. 5A. The wedge shape block 62 is inserted into the first aperture 55 of the transportable wafer cassette 16 using the gripping post 74 of the shuttle assembly 64 to manually operate the first wafer member 18 and moved in the direction of the cassette loading station 28. The inclined wafer engagement surface 78 sequentially engages the flats 92 on the wafers 90 stored in the transportable wafer cassette 16 as the wedge shaped block 62 of the first wafer transfer member 18 moves through the transportable wafer cassette 16, thereby pushing the wafers 90 through the second aperture 57 of the transportable wafer cassette 16 and into the loading end 34 of the fixed wafer receiving cassette 14 The operator continues to push the wafers 90 with the first wafer transfer member 18 until all the wafers 90 are transferred into the fixed wafer receiving cassette 14. Once this is accomplished, the first wafer transfer member 18 is completely withdrawn from both the fixed and transportable wafer cassettes 14, 16. The inclined surface 78 of the wedge-shaped block 62 orients the wafers 90 in the fixed wafer receiving cassette 14 in an axially offset manner so that the identifying indicia 100 on each wafer 90 is readily visible to the operator's eyes. This enables the operator to locate the desired wafers 90 to be removed. This is accomplished by sliding the selected wafer or wafers out the discharge end 36 of the fixed wafer receiving cassette 14.

Figure 5B:
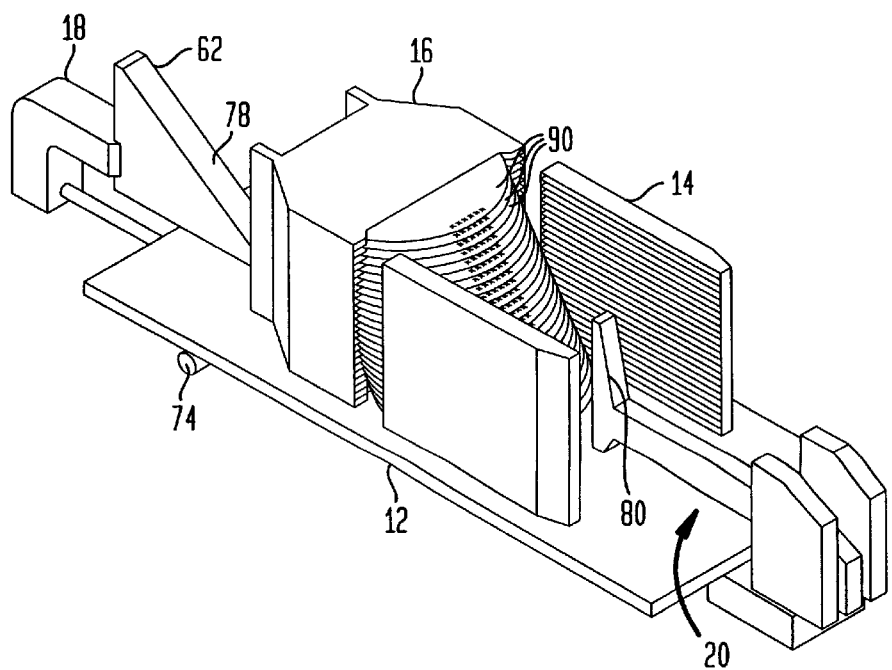

The wafers 90 remaining in the fixed receiving cassette 14 are then transferred back into the transportable wafer cassette 16 using the second wafer transfer member 20 as shown in FIG. 5B. The wafer engaging block 80 of the second wafer transfer member 20 is pivoted down and inserted into the discharge end 36 of the fixed wafer receiving cassette 14. The wafer engaging surface 84 of the engaging block 80 pushes the wafers 90 out of the fixed wafer receiving cassette 14 through the loading end 34 thereof and back into the transportable wafer cassette 16 through the second aperture 57 thereof. The wafer engaging block 80 is then pivoted up so that the transportable wafer cassette 16 can be removed from the base 12.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. An apparatus for allowing an operator to visually read identification indicia disposed on a surface of a plurality of wafers held by a transportable wafer cassette, comprising:
    a base adapted to removably couple the transportable wafer cassette;
    a wafer receiving cassette coupled to said base adjacent to the transportable wafer cassette, said wafer receiving cassette for receiving the plurality of wafers held in the transportable wafer cassette;
    a first reciprocally moveable wafer transfer member attached to said base, said first reciprocally movable wafer transfer member being operative for partially transferring the wafers held in the transportable wafer cassette to said wafer receiving cassette, said wafer transfer member including means for aligning the wafers in said wafer receiving cassette in an axially offset manner relative to each other so that the identification indicia on the surface of each wafer is visible for reading by an operator; and,
    a second reciprocally movable wafer transfer member adjacent to said base, said second reciprocally movable wafer transfer member being operative for transferring the wafers from said wafer receiving cassette to the transportable wafer cassette.

2. The apparatus according to claim 1, wherein said second reciprocally moveable wafer transfer member includes a pivoting wafer engaging member.

3. The apparatus according to claim 1, wherein said first reciprocally movable wafer transfer member is disposed adjacent to the removable wafer cassette.

4. The apparatus according to claim 1, wherein said wafer receiving cassette includes a loading end and a discharge end.

5. The apparatus according to claim 1, wherein said wafer receiving cassette includes first and second wafer support members.

6. The apparatus according to claim 5, wherein said first and second wafer support members define a plurality of wafer supporting slots for slidably receiving the wafers.

7. The apparatus according to claim 1, wherein said wafer aligning means includes a wedge-shaped block.

8. The apparatus according to claim 1, wherein said first reciprocally movable wafer transfer member includes a shuttle assembly coupled to said wafer aligning means, for providing reciprocal movement of said wafer aligning means over said base.

9. An apparatus for allowing an operator to visually read identification indicia disposed on a plurality of wafers, comprising:
    a base having wafer cassette receiving station and a wafer receiving station;
    a transportable wafer cassette removably coupled to said base in said wafer cassette receiving station, said transportable wafer cassette for holding a plurality of wafers each having identification indicia disposed on a surface thereof;
    a wafer receiving cassette coupled to said base adjacent to said transportable wafer cassette in said wafer receiving station, said wafer receiving cassette for receiving the plurality of wafers held in said transportable wafer cassette;
    a first reciprocally moveable wafer transfer member attached to said base, said first wafer transfer member being operative for partially transferring the wafers held in said transportable wafer cassette to said wafer receiving cassette, said wafer transfer member including means for aligning the wafers in said wafer receiving cassette in an axially offset manner relative to each other so that the identification indicia on the surface of each wafer is visible for reading by an operator, whereby after the wafers are aligned in said axially offset manner in said wafer receiving cassette, the operator can identify and remove one or more of the wafers from said wafer receiving cassette; and
    a second reciprocally moveable wafer transfer member disposed adjacent to said base, said second wafer transfer member being operative for transferring the wafers from said wafer receiving cassette to said transportable wafer cassette.

10. The apparatus according to claim 9, wherein said second reciprocally moveable wafer transfer member includes a pivoting wafer engaging member.

11. The apparatus according to claim 9, wherein said first wafer transfer member is disposed adjacent to said removable wafer cassette.

12. The apparatus according to claim 9, wherein said wafer receiving cassette includes a loading end and a discharge end.

13. The apparatus according to claim 9, wherein said wafer receiving cassette includes first and second wafer support members.

14. The apparatus according to claim 13, wherein said first and second wafer support members define a plurality of wafer supporting slots for slidably receiving the wafers.

15. The apparatus according to claim 9, wherein said wafer aligning means includes a wedge-shaped block.

16. The apparatus according to claim 9, wherein said first reciprocally movable wafer transfer member includes a shuttle assembly coupled to said wafer aligning means, for providing reciprocal movement of said wafer aligning means over said base.

17. The apparatus according to claim 9, wherein said wafers comprise semiconductor wafers.

18. The apparatus according to claim 9, further comprising means for aligning said transportable wafer cassette with said wafer receiving cassette.

19. The apparatus according to claim 9, wherein said base is elevated above a support surface by a plurality of foot members which are attached to said base.

20. An apparatus for allowing an operator to visually read identification indicia disposed on a plurality of wafers, comprising:

a substantially planar base having a surface which defines a wafer cassette receiving station and a wafer receiving station;

a transportable wafer cassette removably coupled to said base in said wafer cassette receiving station, said transportable wafer cassette for holding a plurality of wafers in an axially aligned manner, each of said wafers having identification indicia disposed on a surface thereof;

a wafer receiving cassette coupled to said base adjacent to said transportable wafer cassette in said wafer receiving station, said wafer receiving cassette for receiving the plurality of wafers held in said transportable wafer cassette in said axially aligned manner;

a first reciprocally moveable wafer transfer member attached to said base, said first reciprocally movable wafer transfer member being operative for partially transferring the wafers held in said transportable wafer cassette in said axially aligned manner to said wafer receiving cassette, said wafer transfer member including means for aligning the wafers in said wafer receiving cassette in an axially offset manner relative to each other so that the identification indicia on the surface of each wafer is visible for reading by an operator, whereby after the wafers are aligned in said axially offset manner in said wafer receiving cassette, the operator can identify and remove one or more of the wafers from said wafer receiving cassette; and a second reciprocally moveable wafer transfer member disposed adjacent to said base, said second reciprocally moveable wafer transfer member being operative for transferring the wafers from said wafer receiving cassette to said transportable wafer cassette and realigning said wafers in said transportable wafer cassette said axially aligned manner.

21. A method for allowing an operator to visually read identification indicia disposed on a plurality of wafers held in a transportable wafer cassette, the method comprising the steps of:

coupling the transportable wafer cassette to a base in a wafer cassette receiving station;

partially transferring the wafers held in the transportable wafer cassette in an axially aligned manner to said wafer receiving cassette; and aligning the wafers in said wafer receiving cassette in an axially offset manner relative to each other so that the identification indicia on the surface of each wafer is visible for reading by an operator.

22. The method according to claim 21 further comprising the additional step of transferring the wafers from said wafer receiving cassette to the transportable wafer cassette and realigning said wafers in the transportable wafer cassette said axially aligned manner.

* * * * *